US009092013B2

(12) United States Patent
Song et al.

(10) Patent No.: US 9,092,013 B2
(45) Date of Patent: Jul. 28, 2015

(54) TIME-TO-DIGITAL CONVERTER

(71) Applicant: QUALCOMM Incorporated, San Diego, CA (US)

(72) Inventors: Hui William Song, Toronto (CA); Mohamed Hassan Abu-Rahma, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 67 days.

(21) Appl. No.: 14/029,699

(22) Filed: Sep. 17, 2013

(65) Prior Publication Data

US 2015/0077279 A1   Mar. 19, 2015

(51) Int. Cl.
*H03M 1/12* (2006.01)
*G04F 10/00* (2006.01)
*H03M 1/00* (2006.01)
*H03K 5/135* (2006.01)
*H03L 7/081* (2006.01)
*H04M 1/50* (2006.01)
*H03H 11/26* (2006.01)

(52) U.S. Cl.
CPC ............ *G04F 10/005* (2013.01); *H03H 11/265* (2013.01); *H03K 5/135* (2013.01); *H03L 7/0814* (2013.01); *H03M 1/00* (2013.01); *H03M 1/12* (2013.01); *H03M 2201/4233* (2013.01); *H04M 1/505* (2013.01)

(58) Field of Classification Search
CPC . H03M 1/12; H03M 1/00; H03M 2201/4233; H03K 5/135; H03K 9/56; H04M 1/505; H03L 7/0814; H03H 11/265
USPC .......... 341/155, 156, 157, 166; 327/160, 162, 327/107, 158, 290, 93
See application file for complete search history.

(56) References Cited

U.S. PATENT DOCUMENTS

| 7,205,924 | B2 | 4/2007 | Vemulapalli et al. |
| 7,791,525 | B2 | 9/2010 | Rivoir et al. |
| 8,327,179 | B2 | 12/2012 | Hsieh |
| 8,553,503 | B2 * | 10/2013 | Molchanov et al. .......... 368/120 |
| 2013/0038349 | A1 | 2/2013 | Hsu et al. |

FOREIGN PATENT DOCUMENTS

WO   2013034770 A2   3/2013

OTHER PUBLICATIONS

Choi, et al., "A Time-to-Digital Converter Based on a Multiphase Reference Clock and a Binary Counter With a Novel Sampling Error Corrector," IEEE Transactions on Circuits and Systems—II: Express Briefs, vol. 59, No. 3, Mar. 2012, pp. 143-147.

* cited by examiner

*Primary Examiner* — Joseph Lauture
(74) *Attorney, Agent, or Firm* — Novak Druce Connolly Bove + Quigg LLP

(57) ABSTRACT

Time-to-digital converters (TDC) with improved resistance to metastability are provided. The TDC includes a ring oscillator gated by a start signal. A stop signal triggers capturing values of phase signals from the ring oscillator using master-slave flip-flops. Signals from two of the master stages of the flip-flops are logically combined to produce a counter clock signal that causes a counter to count. The outputs of the flip-flops and of the counter are encoded to produce a digital representation of the time between transitions of the start signal and the stop signal. Since the signals from the master stages of flip-flops are captured (and stop toggling) by the stop signal, the counter clock signal stops toggling, and the counter stops counting. This assures that the values of the captured phase signals and the counter are consistent and avoids metastability errors that could otherwise occur.

21 Claims, 5 Drawing Sheets

TIME-TO-DIGITAL CONVERTER

BACKGROUND

1. Field

The present invention relates to time-to-digital converter circuits and, more particularly, to time-to-digital converter circuits with resistance to metastability errors.

2. Background

Systems such as delay-locked loops (DLL) and phase-locked loops (PLLs), in particular, all-digital phase locked loops (ADPLL) may use time-to-digital converter (TDC) circuits to measure the time between events (signal transitions). TDC circuits may also be used to measure circuit delays, for example, in a dynamic voltage scaling system. If a TDC circuit produces erroneous values, operation of the system using the TDC circuit will be impaired.

TDC circuits measure times between signal transitions that are asynchronous. The asynchronous operation can cause measurement errors in a TDC circuit for some signal timings. The error can be large, for example, on the order of one hundred times the resolution of the output. Such errors can greatly impair operation of a system using the TDC circuit.

SUMMARY

Systems and methods that perform time-to-digital conversion with improved resistance to metastability are provided. An exemplary time-to-digital converter includes a ring oscillator gated by a start signal. A stop signal triggers capturing values of phase signals from the ring oscillator using master-slave flip-flops. Signals from the master stages of two of the flip-flops are logically combined to produce a counter clock signal that triggers a counter. The outputs of the flip-flops and of the counter are encoded to produce a digital representation of the time between transitions of the start signal and the stop signal. Since the signals from the master stages of flip-flops are captured (and stop toggling) by the stop signal, the counter clock signal stops toggling, and the counter stops counting. This assures that the values of the captured phase signals and the counter are consistent and avoids metastability errors that could otherwise occur.

In one aspect, a time-to-digital converter is provided. The time-to-digital converter comprises a ring oscillator circuit configured to produce phase signals; a counter circuit configured to count oscillations of the ring oscillator circuit; a sampling circuit configured to capture values of the phase signals based on a stop signal, the sampling circuit including master latches enabled based on the stop signal, each of the master latches having an input coupled to one of the phase signals; and a clock generation circuit configured to produce a counter clock signal for triggering the counter circuit based on two or more outputs of the master latches.

In one aspect, a method for time-to-digital conversion is provided. The method comprises producing oscillating phase signals; sampling values of the phase signals based on a stop signal, the sampling producing sampled outputs that track the phase signals when the stop signal is inactive; and counting oscillations of the phase signals, the counting triggered based on two or more of the sampled values of the phase signals.

In one aspect, an apparatus for time-to-digital conversion is provided. The apparatus comprises a means for producing a plurality of oscillating phase signals; a means for sampling values of the phase signals based on a stop signal, the sampling producing sampled outputs that track the phase signals when the stop signal is inactive; and a means for counting oscillations of the phase signals, the counting triggered based on two or more of the sampled values of the phase signals.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

Figure 1:
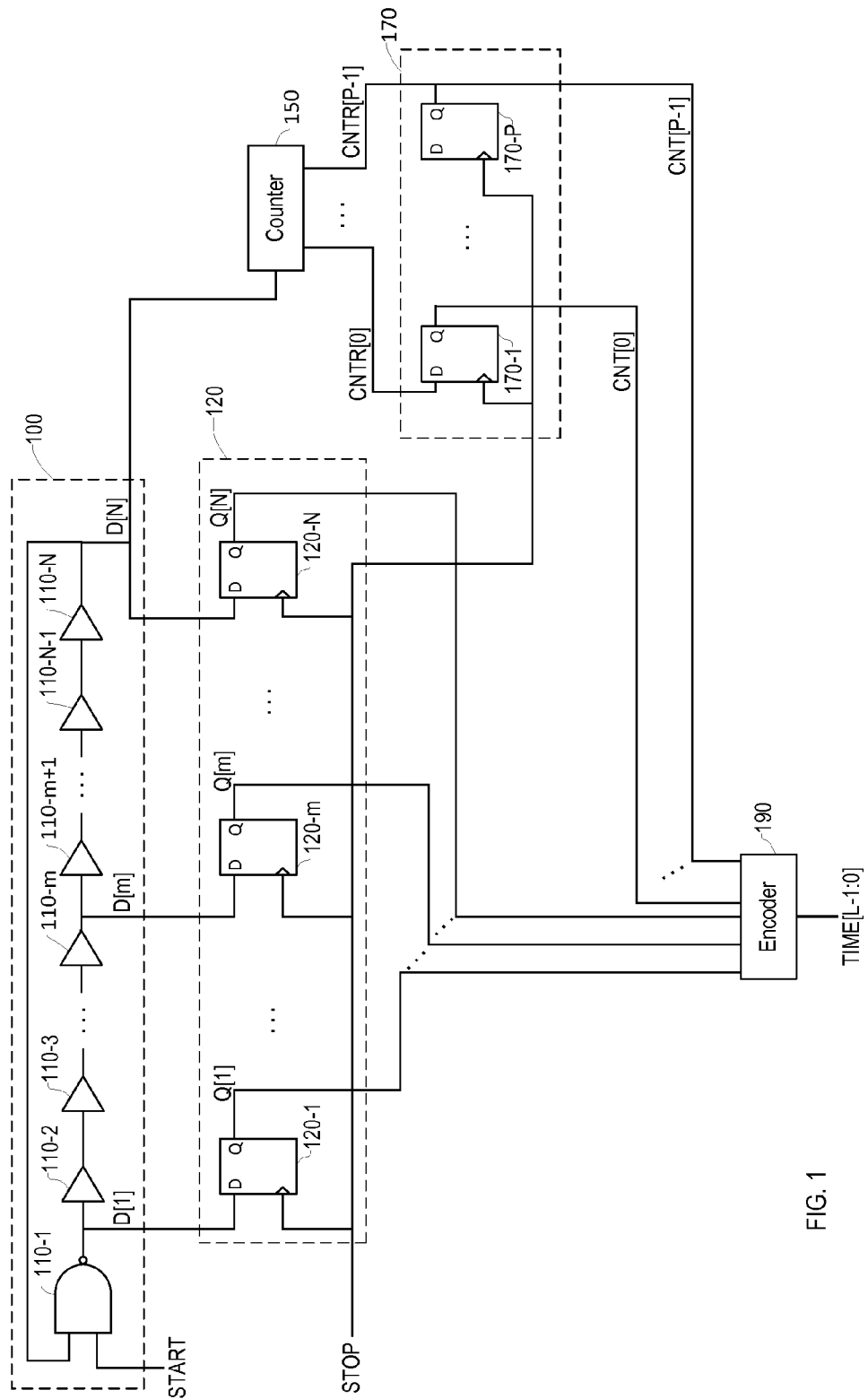
FIG. 1 is a schematic diagram of a time-to-digital converter.

FIG. 1 is a schematic diagram of a time-to-digital converter (TDC). The TDC receives a START signal and a STOP signal and produces a TIME output. The TIME output digitally represents the time from a transition on the START signal to a transition on the STOP signal.

Signals of the TDC may be described as having a logic ONE or ZERO value The value of a signal may also be described as active (or inactive) when a function associated with the signal is enabled (or disabled). The ONE value is commonly represented by a high voltage (relative to a common or ground reference) and the ZERO value by a low voltage. The transition of a signal from a ZERO to a ONE may be referred to as a rising edge and the transition from a ONE to a ZERO as a falling edge. The logic values may be represented by other physical conditions (e.g., currents or differential voltages).

The TDC includes a gated ring oscillator 100 coupled to a counter 150. The gated ring oscillator 100 includes N delay elements 110. A first one of the delay elements is a NAND gate 110-1. The other delay elements may be, for example, two invertors coupled in series. The delay elements 110 are coupled sequentially with the output of the first delay element 110-1 coupled to the input of the second delay element 110-2, the output of the second delay element 110-2 coupled to the input of the third delay element 110-3, and so on through the output of the N-1st delay element 110-N−1 coupled to the input of the Nth delay element 110-N. The output of the Nth delay element 110-N is coupled to an input of the NAND gate 110-1. The START signal is coupled to another input of the NAND gate 110-1.

When the START signal is a logic ONE, the output of the first delay element (the NAND gate 110-1) is an inverted (and delayed by the switching delay of the NAND gate 110-1) version of the output of the Nth delay element 110-N. In this case, the gated ring oscillator 100 operates as a ring oscillator. Transitions from ONE to ZERO propagate from the output of the NAND gate 110-1 to the output the Nth delay element 110-N through each of the delay elements. The output of the Nth delay element 110-N is inverted by the NAND gate 110-1 and then transitions from ZERO to ONE propagate from the output of the NAND gate 110-1 to the output the Nth delay element 110-N through each of the delay elements. The output of the Nth delay element 110-N is again inverted by the NAND gate 110-1 and the sequence repeats.

When the START signal is a logic ONE and the gated ring oscillator 100 is operating as a ring oscillator, the outputs of the delay elements oscillate at a common frequency but have different phases due to propagation delays of the delay elements. Accordingly, the outputs of the delay elements may be referred to as phase signals.

When the START signal is a logic ZERO, the output of the NAND gate 110-1 is a logic ONE. In this case, the gated ring oscillator 100 is static with each of the outputs of the delay elements also being (after circuit propagation delays) a logic ONE.

The counter 150 is coupled to the output of the Nth delay element 110-N and counts transitions on the output of the Nth delay element 110-N. The counter 150 can, in an embodiment, count both transitions from ONE to ZERO and from ZERO to ONE. The counter 150 may be reset when the START signal is ZERO.

The outputs of the delay elements 110 of the gated ring oscillator 100 are sampled by a first set of flip-flops 120. The outputs of the counter 150 are sampled by a second set of flip-flops 170. The first set of flip-flops 120 and the second set of flip-flops 170 are edge-triggered flip-flops that save the status of their input signals on rising edges of the STOP signal.

An encoder 190 receives the outputs from the first set of flip-flops 120 and the second set of flip-flops 170. The encoder 190 processes (e.g., by logical combination) the received signals to produce the TIME output. For example, the encoder 190 may convert the outputs from the first set of flip-flops 120 from thermometer code to binary code and concatenate the binary code with the outputs of the second set of flip-flops 170. The TIME output may be considered as including coarse and fine parts. The coarse part, determined generally using the counter 150, indicates the number of cycles of oscillation that occurred in the gated ring oscillator 100 between activation of the START signal and activation of the STOP signal. The fine part, determined generally using the phase signals, indicates the number of partial cycles of oscillation that occurred in the gated ring oscillator 100 between activation of the START signal and activation of the STOP signal.

Figure 2:
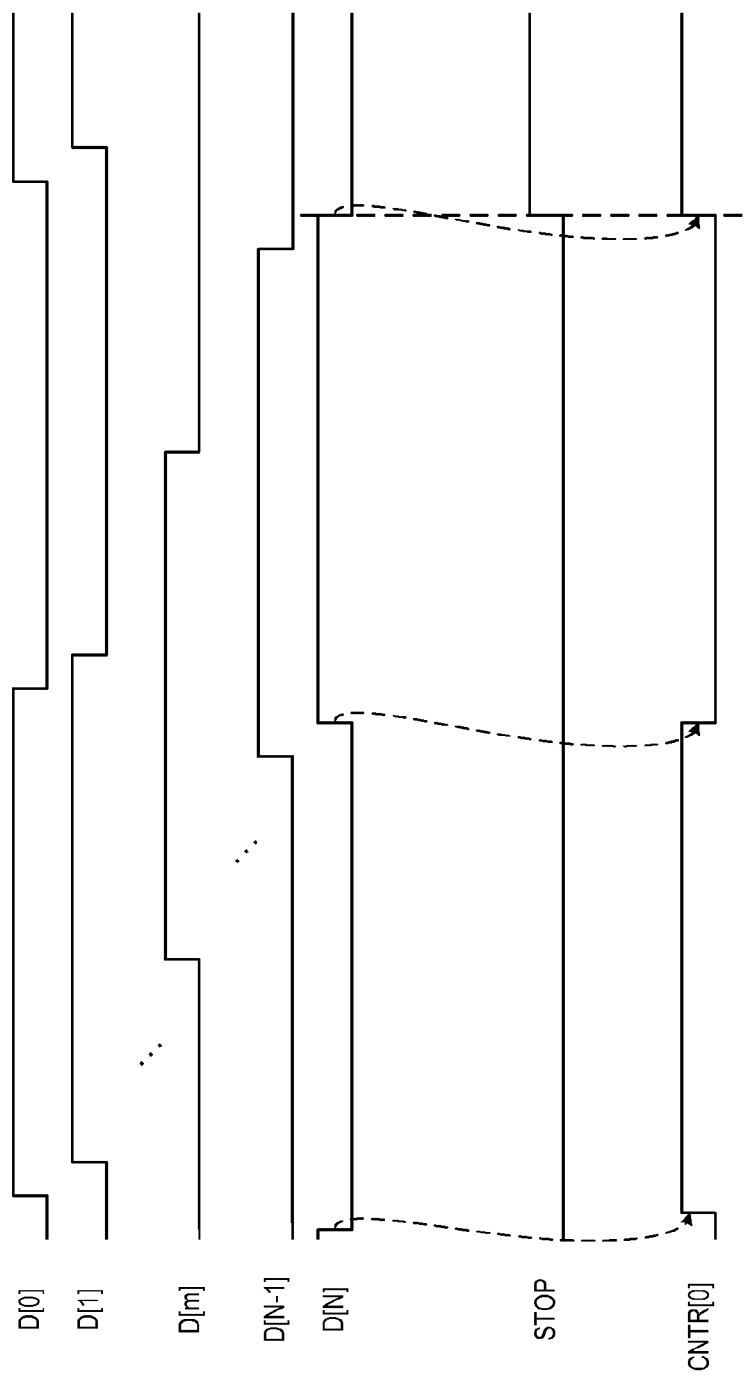
FIG. 2 is a timing diagram illustrating operation of the time-to-digital converter of FIG. 1.

FIG. 2 is a timing diagram illustrating operation of the TDC of FIG. 1. FIG. 2 shows example waveforms for various signals of the TDC preceding and shortly after activation of the STOP signal. The timing diagram of FIG. 2 illustrates a case where the STOP signal transitions from LOW to HIGH close in time to when the output of the Nth delay element 110-N transitions.

The timing of the STOP signal is asynchronous with respect to oscillation of the gated ring oscillator 100 and counts of the counter 150. Thus, the phase signals that are sampled by the first set of flip-flops 120 and the counter outputs that are sampled by the second set of flip-flops 170 are asynchronous with respect to the STOP signal that triggers the flip-flops. Since the data and clock inputs to the flip-flops are asynchronous, the setup and hold times associated with the flip-flops will at least occasionally be violated.

When the setup and hold times are violated, operation of the flip-flops can be uncertain. For example, transitions on the outputs of the flip-flops may be greatly delayed. The delay may be so large as to cause erroneous operation of the encoder 190. This problem is often referred to as metastability.

Errors due to metastability can be seen when two flip-flops sample related signals. Metastability-induced delays can cause the two flip-flops to sample inconsistent values. This type of problem may be referred to as sampling error.

In the TDC of FIG. 1, the values of the phase signals sampled by the first set of flip-flops 120 and values of counter outputs sampled the second set of flip-flops 170 can correspond to different cycles of the gated ring oscillator 100. That is, the first set of flip-flops 120 could sample values of the phase signals that indicate an extra oscillation cycle has occurred relative to the values of the counter outputs sampled by the second set of flip-flops 170. Additionally, the second set of flip-flops 170 could sample values of the counter outputs that indicate an extra oscillation cycle has occurred relative to the values of the phase signals sampled by the first set of flip-flops 120. For the example case illustrated in FIG. 2, the output D[N] of the Nth delay element 110-N is falling and the output CNTR[0] of the first bit of the counter 150 is rising approximately the same time as the STOP signal rises. The TDC could sample, for example, due to differing delays and thresholds in the associated circuits, the output D[N] from the gated ring oscillator 100 and the output CNTR[0] from the counter 150 to be any combination of ONEs and ZEROs. The combinations corresponding to cases where only one of the sampled signals has transitioned are inconsistent and result in errors.

When inconsistent sample values are encoded by the encoder 190, the TIME value includes an error corresponding to a full period of oscillation of the gated ring oscillator 100. Errors in the TIME value can cause impaired operation of a device that uses the TDC. For example, when used in an ADPLL the errors can increase jitter.

Figure 3:
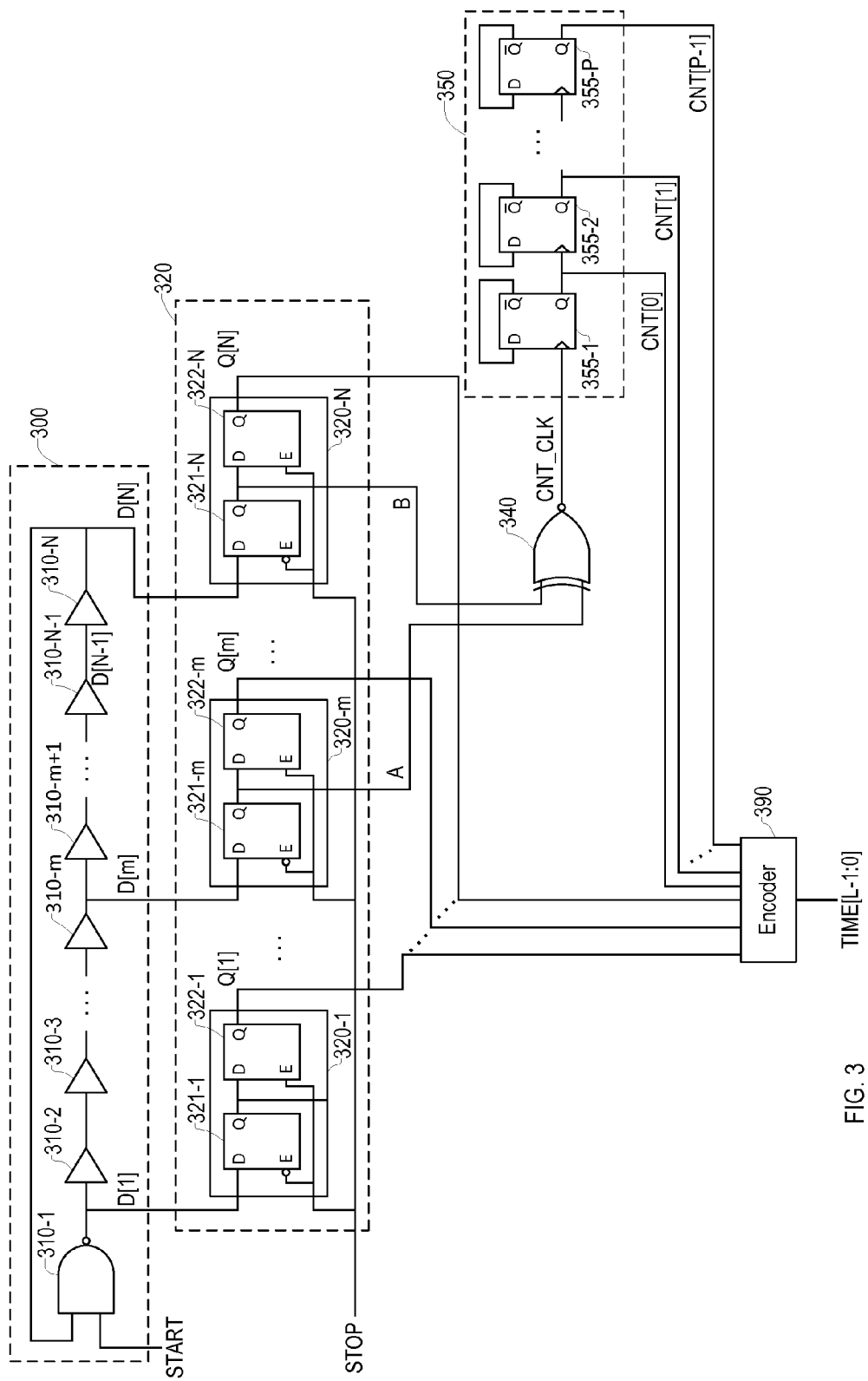
FIG. 3 is a schematic diagram of a time-to-digital converter according to a presently disclosed embodiment.

FIG. 3 is a schematic diagram of a time-to-digital converter (TDC) according to a presently disclosed embodiment. The TDC is similar to the TDC of FIG. 1 with its functional elements operating as described in connection with FIG. 1 unless otherwise noted. The TDC of FIG. 3 receives a START signal and a STOP signal and produces a TIME output signal that digitally represents the time from a transition on the START signal to a transition on the STOP signal. The TDC of FIG. 3 provides resistance to metastability and sampling errors.

The TDC includes a gated ring oscillator 300 that is coupled to a counter 350. The gated ring oscillator 300 may be the same as or similar to the gated ring oscillator 100 of FIG. 1 and operates as described above.

The counter 350, in the illustrated embodiment, is a ripple counter. Other types of counters may also be used. The counter 350 includes P toggle flip-flops 355 coupled in sequence. The first toggle flip-flop 355-1 toggles on rising edges of a counter clock signal CNT_CLK. The second toggle flip-flop 355-2 toggles on rising edges of the output of the first toggle flip-flop 355-1 and so on through the Pth toggle flip-flop 355-P toggling on rising edges of the output of the P-1st toggle flip-flop. The counter 350 may be reset before a time measurement. The counter 350 produces a P-bit counter output CNT.

The outputs of the delay elements 310 of the gated ring oscillator 300 are sampled by sampling flip-flops 320. The outputs of the counter 350 are not sampled by an additional set of flip-flops in the embodiment illustrated in FIG. 3. The sampling flip-flops 320 are edge-triggered flip-flops that save the status of their input signals on rising edges of the STOP signal. Each of the flip-flops includes a master latch 321 coupled in series with a slave latch 322. The master latch 321 is a transparent latch that is enabled when the STOP signal is ZERO. The slave latch 322 is a transparent latch that is enabled when the STOP signal is ONE. The master latch 321 may be considered to provide sampling of the phase signals and the slave latch 322 to provide holding of the sampled values.

The output (signal B) of the Nth master latch 321-N and the output (signal A) of the mth master latch 321-m are received by a clock generation circuit and used to produce the counter clock signal CNT_CLK that triggers the counter 350. The clock generation circuit, in the embodiment shown in FIG. 3, includes an XNOR gate 340 that compares signal A and signal B to produce the counter clock signal CNT_CLK. The counter clock signal CNT_CLK is ZERO when the two signals are different and ONE when the two signals are equal. Other clock generation circuits may alternatively be used to produce the counter clock signal CNT_CLK.

When the STOP signal is a ZERO, signal A tracks (equals with some propagation delay) the mth phase signal D[m] and signal B tracks the Nth phase signal D[N]. The mth phase signal D[m] may be, for example, a signal near the middle of the gated ring oscillator 100. For example, in an implementation with 64 delay elements, the mth phase signal D[m] may be the output of the 32nd delay element. Selecting the middle phase signal for use in producing the counter clock signal CNT_CLK provides a clock signal for the counter that has approximately equal high and low times. Other phase signals may be used, for example, to produce a different duty cycle of the counter clock signal.

When the STOP signal transitions to a ONE, signal A and signal B cease tracking their respective phase signals. The master latches 321 capture, or sample, the phase signals when the STOP signal transitions to a ZERO. The values captured by the master latches 321 are propagated through the slave latches 322 while the STOP signal is a ONE.

Signal A and signal B retain the captured values of the phase signals while the STOP signal is a ONE. Since the counter clock signal CNT_CLK is generated from signal A and signal B which cease toggling, the counter clock signal CNT_CLK also ceases toggling when the STOP signal transitions to a ONE. Since the counter 350 is triggered by the counter clock signal CNT_CLK, the counter 350 also ceases counting when the STOP signal transitions to a ONE. Since the counter 350 is triggered by the same signals that are captured by the sampling flip-flops 320 the state of the counter will be consistent with the state of the sampled phase signals.

That the counter clock signal CNT_CLK ceases toggling when the STOP signal is a ONE removes the need to sample the outputs of the counter 350 with a second set of flip-flops. This also facilitates implementing the counter 350 with a ripple counter without concern for inconsistent sampling of the counter outputs by the second set of flip-flops.

Figure 4:
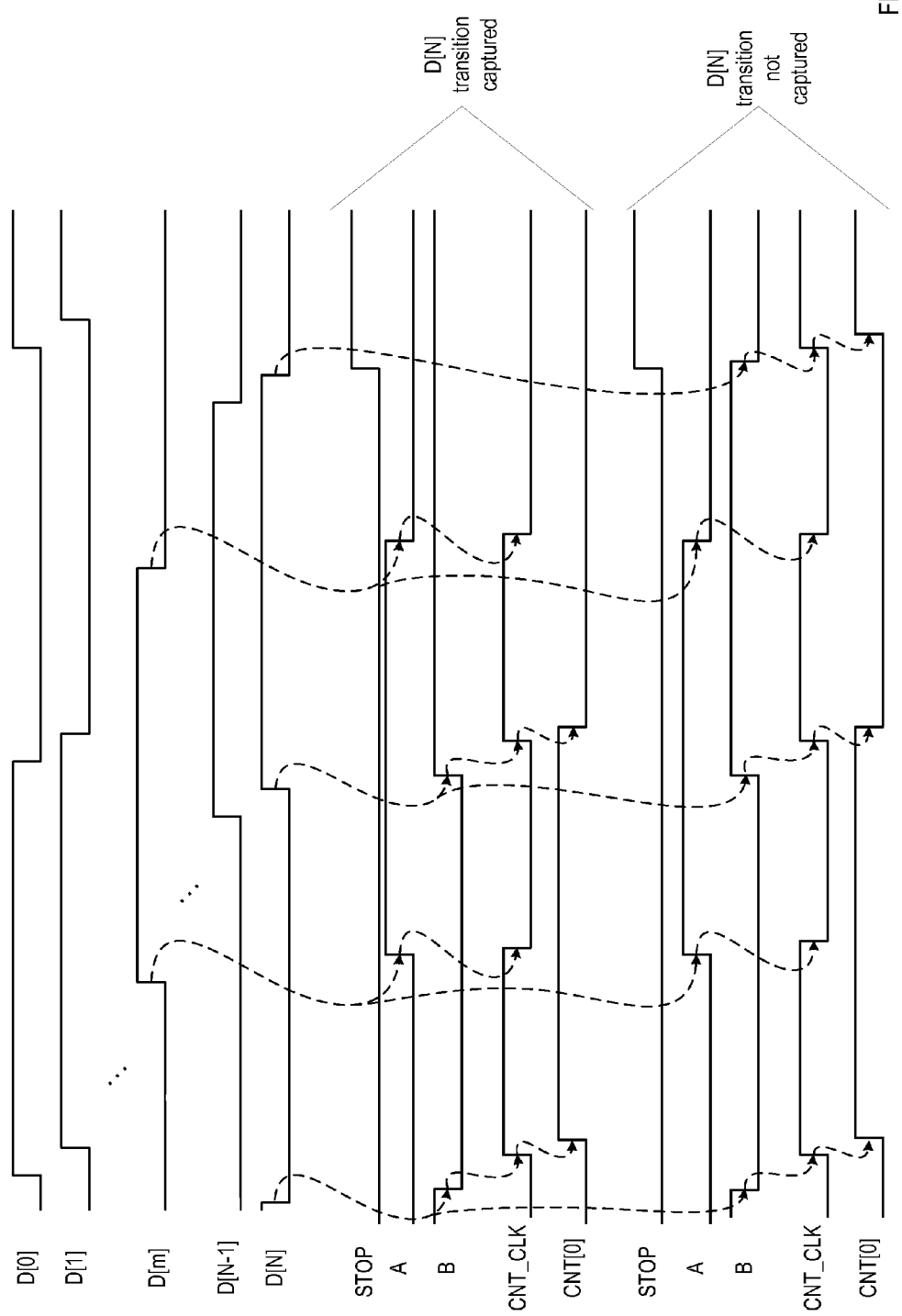
FIG. 4 is a timing diagram illustrating operation of the time-to-digital converter of FIGS. 3.

FIG. 4 is a timing diagram illustrating operation of the TDC of FIG. 3. FIG. 4 shows example waveforms for various signals of the TDC preceding and shortly after activation of the STOP signal. The timing diagram of FIG. 4 illustrates two cases where the STOP signal transitions from LOW to HIGH at approximately the same time as when the output of the Nth delay element 310-N transitions.

At the beginning of the example waveforms, the Nth phase signal D[N] transitions from ONE to ZERO. Since the STOP signal is ZERO, the Nth master latch 321-N is enabled and signal B follows the Nth phase signal D[N] and transitions from ONE to ZERO. Since the signal A which tracks the mth phase signal D[m] is ZERO, the counter clock signal CNT_CLK transitions from ZERO to ONE. This rising edge triggers the counter 350 and the least-significant bit of the counter output CNT[0] transitions from ZERO to ONE.

The falling edge of the Nth phase signal D[N] is inverted by the NAND gate 310-1. The inverted falling (rising) edge propagates through the delay elements 310. When the rising edge reaches the mth delay element 310-m, the mth phase signal D[m] transitions from ZERO to ONE. Since the STOP signal is ZERO, the mth master latch 321-m is enabled and signal A follows the mth phase signal D[m] and transitions from ZERO to ONE. Since the signal B which tracks the Nth phase signal D[N] is ZERO, the counter clock signal CNT_CLK transitions from ONE to ZERO. This falling edge does not trigger the counter 350.

The rising edge will reach the Nth delay element and cause Nth phase signal D[N] to transition from ZERO to ONE. The Nth master latch 321-N is enabled and signal B follows the Nth phase signal D[N] and also transitions from ZERO to ONE. Since the signal A which tracks the mth phase signal D[m] is ONE, the counter clock signal CNT_CLK again transitions from ZERO to ONE. This rising edge triggers the counter 350 and the least-significant bit of the counter output CNT[0] transitions from ONE to ZERO. This sequence continues with the counter clock signal CNT_CLK having a rising edge corresponding to each transition of the Nth phase signal D[N] and a falling edge corresponding to each transition of the mth phase signal D[m]. Thus, the counter clock signal CNT_CLK toggles at twice the rate of the phase signals. Accordingly, the counter 350 acts as a double-edged counter.

The first example case in FIG. 4 illustrates signal waveforms for when the Nth sampling flip-flop 320-N does not capture the transition of the Nth phase signal D[N] that occurs at approximately the same time as when the STOP signal rises. Accordingly, the output of the Nth master latch 321-N (signal B) does not include a transition corresponding to the transition of the Nth phase signal D[N] near the rising edge of the STOP signal. Since signal B does not transition, the counter clock signal CNT_CLK also does not transition and the counter 350 stops counting.

The second example case in FIG. 4 illustrates signal waveforms for when the Nth sampling flip-flop 320-N captures the transition of the Nth phase signal D[N] that occurs at approximately the same time as when the STOP signal rises. Accordingly, the output of the Nth master latch 321-N (signal B) also includes a transition corresponding to the transition of the Nth phase signal D[N] near the rising edge of the STOP signal. Since signal B has transitioned, the counter clock signal CNT_CLK also transitions and the counter 350 includes a final count.

In both the first and second example cases, the sampled phase signals and final counter values are consistent. In the first example, a final transition of the Nth phase signal D[N] near the rising edge of the STOP signal is not included. In the second example, the final transition of the Nth phase signal D[N] near the rising edge of the STOP signal is included.

Returning to FIG. 3, an encoder 390 receives the sampled phase signals Q from the sampling flip-flops 320 and the outputs of the counter 350. Alternatively, the encoder 390 may receive the outputs of the master latches 321 to use as the sampled phase signals. The encoder 390 processes the received signals to produce the TIME output. The processing by the encoder 390 may be similar to the encoder 190 of FIG. 1. However, the resistance to metastability and sampling errors can allow simpler encoding logic. For example, circuitry designed to detect inconsistencies between the samples of the phase signals and the samples of the counter may be omitted.

Figure 5:
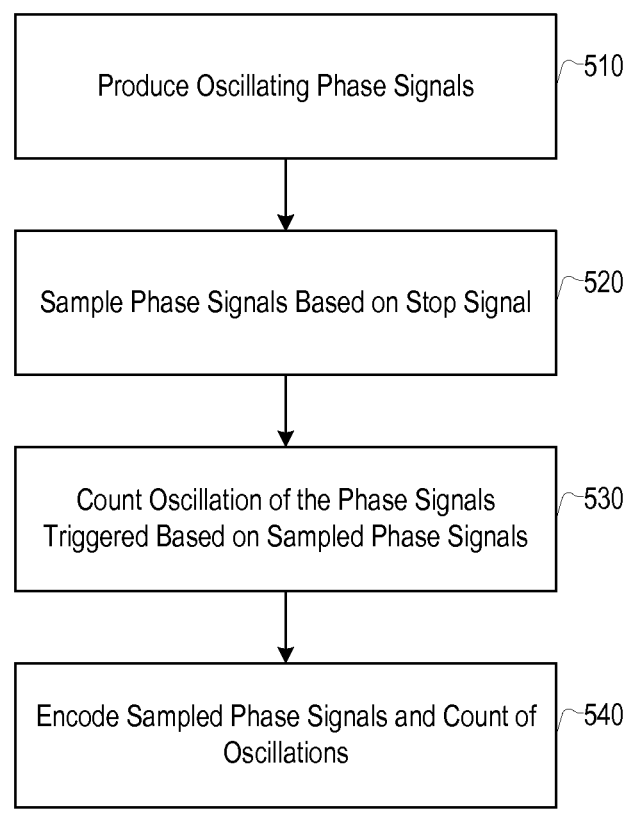
FIG. 5 is a flowchart illustrating a process for time-to-digital conversion according to a presently disclosed embodiment.

FIG. 5 is a flowchart illustrating a process for time-to-digital conversion according to a presently disclosed embodiment. The process may be performed, for example, by one of the time-to-digital converters described above. To provide a specific example, aspects of the process will be described with reference to the time-to-digital converter of FIG. 3.

In step 510, oscillating phase signals are produced. Producing the oscillating phase signals may be gated by a start signal. For example, the gated ring oscillator 300 can produce the phase signals D[1-N].

In step 520, the phase signals are sampled based on a stop signal. For example, the sampling flip-flops 320 can sample the phase signals D[1-N]. The sampled phase signals track the phase signals when the stop signal is inactive. In addition, the sampled phase signals may also be held for further use.

In step 530, oscillations of the phase signals are counted. The counting is triggered based on one or more of the sampled phase signals. For example, signal A from the mth master latch 321-m and signal B from the Nth master latch 321-N can be compared by the XNOR gate 340 to produce the counter clock signal CNT_CLK that triggers the counter 350.

In step 540, the held sampled values of the phase signals and the counted oscillations of the phase signals are encoded to produce a digital representation of the measured time. For example, the sampled phase signals from the sampling flip-flops 320 and the outputs of the counter 350 can be encoded by the encoder 390.

The process for time-to-digital conversion may be modified, for example, by adding, omitting, reordering, or altering steps. Additionally, the steps may be performed concurrently.

Although embodiments of the invention are described above for particular embodiments, many variations of the invention are possible including, for example, those with different signal polarities.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

Circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A time-to-digital converter, comprising:
   a ring oscillator circuit configured to produce phase signals;
   a counter circuit configured to count oscillations of the ring oscillator circuit;
   a sampling circuit configured to capture values of the phase signals based on a stop signal, the sampling circuit including master latches enabled based on the stop signal, each of the master latches having an input coupled to one of the phase signals; and
   a clock generation circuit configured to produce a counter clock signal for triggering the counter circuit based on two or more outputs of the master latches, respectively.

2. The time-to-digital converter of claim 1, wherein the clock generation circuit includes a circuit that compares two of the outputs of the master latches to produce the counter clock signal.

3. The time-to-digital converter of claim 2, wherein the ring oscillator circuit includes N delay elements, and wherein the two outputs of the master latches are associated with delay elements of the ring oscillator circuit spaced by approximately N/2.

4. The time-to-digital converter of claim 1, wherein the counter circuit includes a ripple counter that is triggered by the counter clock signal.

5. The time-to-digital converter of claim 1, wherein the master latches are enabled while the stop signal is inactive.

6. The time-to-digital converter of claim 5, wherein the sampling circuit further includes slave latches, each of the slave latches having an input coupled to the output of one of the master latches, the slave latches enabled while the stop signal is active.

7. The time-to-digital converter of claim 6, wherein the ring oscillator circuit includes a gated ring oscillator enabled by a start signal.

8. The time-to-digital converter of claim 7, further comprising an encoder circuit coupled to outputs of the slave latches and to outputs of the counter circuit, the encoder circuit configured to produce a digital representation of the time between a transition of the start signal and a transition of the stop signal.

9. A method for time-to-digital conversion, comprising:
   producing oscillating phase signals;
   sampling values of the phase signals based on a stop signal, the sampling producing sampled outputs that track the phase signals when the stop signal is inactive; and
   counting oscillations of the phase signals, the counting triggered based on two or more of the sampled values of the phase signals, respectively.

10. The method of claim 9, wherein the counting is triggered based on comparing two of the sampled values of the phase signals.

11. The method of claim 10, wherein there are N phase signals, and wherein the two of the sampled values of the phase signals that are compared are spaced by approximately N/2.

12. The method of claim 9, further comprising holding the sampled values of the phase signals, the holding enabled while the stop signal is active.

13. The method of claim 12, wherein producing the oscillating phase signals is enabled by a start signal.

14. The method of claim 13, further comprising encoding the held sampled values of the phase signals and the counted oscillations of the phase signals to produce a digital representation of the time between a transition of the start signal and a transition of the stop signal.

15. An apparatus for time-to-digital conversion, comprising:
- a means for producing a plurality of oscillating phase signals;
- a means for sampling values of the phase signals based on a stop signal, the sampling producing sampled outputs that track the phase signals when the stop signal is inactive; and
- a means for counting oscillations of the phase signals, the counting triggered based on two or more of the sampled values of the phase signals, respectively.

16. The apparatus of claim 15, wherein the counting is triggered based on comparing two of the sampled values of the phase signals.

17. The apparatus of claim 16, wherein the means for producing the plurality oscillating phase signals includes N delay elements, and wherein the two of the sampled values of the phase signals are associated with delay elements spaced by approximately N/2.

18. The apparatus of claim 16, wherein the means for counting includes a ripple counter that is triggered when the two of the sampled values of the phase signals are equal.

19. The apparatus of claim 15, further comprising a means for holding the sampled values of the phase signals, the holding enabled while the stop signal is active.

20. The apparatus of claim 19, wherein the means for producing the plurality of oscillating phase signals includes a gated ring oscillator enabled by a start signal.

21. The apparatus of claim 20, further comprising a means for encoding the held sampled values of the phase signals and the counted oscillations of the phase signals to produce a digital representation of the time between a transition of the start signal and a transition of the stop signal.

* * * * *